(12) United States Patent
Ong et al.

(10) Patent No.: US 7,667,966 B2
(45) Date of Patent: Feb. 23, 2010

(54) INVISIDUCT—AIRFLOW OPTIMIZATION DEVICE

(75) Inventors: Brett C. Ong, San Jose, CA (US); William A. De Meulenaere, Newark, CA (US); Timothy W. Olesiewicz, Dublin, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 62 days.

(21) Appl. No.: 12/147,296

(22) Filed: Jun. 26, 2008

(65) Prior Publication Data

US 2009/0323283 A1  Dec. 31, 2009

(51) Int. Cl.
*H05K 7/20* (2006.01)
*F28F 13/08* (2006.01)
*A47B 77/08* (2006.01)
*F28F 7/00* (2006.01)

(52) U.S. Cl. ......................... 361/695; 454/284; 454/309; 454/184; 361/679.49; 361/679.48; 312/236; 165/80.2

(58) Field of Classification Search .................. 361/695, 361/724–727, 679; 313/33, 46; 312/236; 24/458, 454, 520; 257/712–722
See application file for complete search history.

(56) References Cited

U.S. PATENT DOCUMENTS 4,233,040 A * 11/1980 Vogelaar et al. ............ 55/282.5

FOREIGN PATENT DOCUMENTS

JP   05310188 A  * 11/1993
JP   05319086 A  * 12/1993

* cited by examiner

*Primary Examiner*—Jayprakash N Gandhi
*Assistant Examiner*—Jerry Wu
(74) *Attorney, Agent, or Firm*—Osha·Liang LLP

(57) ABSTRACT

A fan enclosure for a system including one more fans and a system enclosure includes a first pivot removably attached to the system enclosure, a safety compliant fan grill attached to the first pivot rotatably between a natural closed position and a forced open position, and a cam disposed on the safety compliant fan grill. The safety compliant fan grill covers the one or more fans in the natural closed position. The cam is configured to force the safety compliant fan grill into the forced open position when a top cover of the system enclosure is placed in a closed position.

8 Claims, 1 Drawing Sheet

INVISIDUCT—AIRFLOW OPTIMIZATION DEVICE

BACKGROUND OF INVENTION

Fans are an integral component in cooling modern computer systems. In order to comply with safety standards in place with respect to fans, fan enclosures are required to prevent injuries resulting from fans during, for example, service of computer systems. Product safety testing companies, such as Underwriter Laboratories, perform certification testing on fan enclosures to ensure they meet safety standards.

One general rule for ensuring safety is the so-called "finger test," wherein any fan enclosure that prevents a finger from accidentally contacting a moving fan is considered sufficiently safe. Those skilled in the art will appreciate that many different designs exists that meet the finger test. However, those skilled in the art will also appreciate that such designs must also be made to not overly impede the airflow of the fan.

SUMMARY OF THE INVENTION

A fan enclosure for a system including one more fans and a system enclosure is disclosed herein. The fan enclosure includes a first pivot removably attached to the system enclosure, a safety compliant fan grill attached to the first pivot rotatably between a natural closed position and a forced open position, and a cam disposed on the safety compliant fan grill. The safety compliant fan grill covers the one or more fans in the natural closed position. The cam is configured to force the safety compliant fan grill into the forced open position when a top cover of the system enclosure is placed in a closed position.

Other aspects and advantages of the invention will be apparent from the following description, the drawings and the claims.

DETAILED DESCRIPTION

Specific details of the present disclosure will now be described in detail with reference to the accompanying figures.

Figure 1:
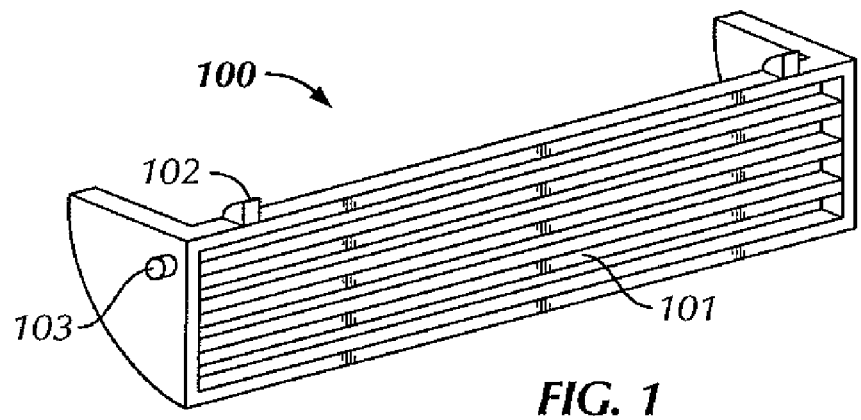
FIG. 1 shows a perspective view of a fan enclosure in accordance with embodiments disclosed herein.

Referring now to FIG. 1, a perspective view of a fan enclosure in accordance with embodiments disclosed herein is shown. The fan enclosure 100 includes a safety compliant grill 101, a cam 102, and a pivot 103. The safety compliant grill provides the basis for the safety feature of the fan enclosure 100. The safety compliant grill 101 includes a series of horizontal guards which may prevent, for example, a finger from coming into contact with the blade of a moving fan.

While horizontal guards are shown in this example, the invention is not so limited, and any grill arrangement that allows air flow while still preventing injury may be used in accordance with the embodiments disclosed herein. For example, the guards may be formed vertically, angled, or any combination thereof. The safety compliant grill 101, cam 102, and pivot 103 may be integrally formed. Further, in one or more embodiments, each of the safety compliant grill 101, cam 102, and pivot 103 may be formed from a plastic material or other suitable lightweight metal.

The pivot 103 is configured to rotatably attach the fan enclosure 100 to a system enclosure. A second pivot (not shown) is disposed on the opposite side of the fan enclosure 100 from the pivot 103. The pivot allows the fan enclosure 100 to rotate between a natural closed position, in which it obstructs access to the blades of one or more moving fans thereby preventing injury, and a forced open position. While the fan enclosure 100 provides maximum safety benefits in the natural closed position, this position also creates turbulent air flow through the system enclosure, resulting in less than optimal cooling. Advantageously, because the fan enclosure 100 rotates between the natural closed position and the forced open position, it is possible to disrupt air flow only when necessary, such as, for example, when a top cover is removed from the system enclosure for servicing. The cam 102 enables the top cover to govern whether the fan enclosure 100 is in the natural closed or forced open position.

Alternatively, a rod may be disposed through the fan enclosure 100 in place of the pair of pivots. The rod may be formed from either a plastic, metal, or other suitable material. Advantageously, using a solid rod may lend additional structural support to the system enclosure.

Figure 2A:
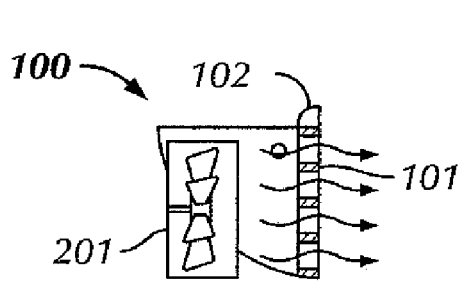
FIG. 2(a) shows a side view of a fan enclosure in accordance with embodiments disclosed herein.

Referring now to FIG. 2(a), a side view of a fan enclosure 100 in accordance with embodiments disclosed herein is shown. A fan enclosure 100 is shown in its natural closed position relative to a system fans 201. FIG. 2(a) illustrates how the fan enclosure 100 prevents injury in this natural closed position, but also, disrupts air flow. The fan enclosure position is shown assuming that a top cover of the system enclosure is removed or in an open position. When the top cover is in the open position, the cam 102 sits freely above the safety compliant grill 101.

Figure 2B:
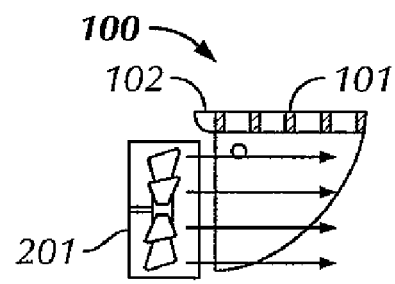
FIG. 2(b) shows a side view of a fan enclosure in accordance with embodiments disclosed herein.

Referring now to FIG. 2(b), a side view of the fan enclosure 100 in accordance with embodiments disclosed herein is shown. In this case, the fan enclosure position is shown assuming that the top cover of the system enclosure is in a closed position. Because the top cover prevents user access to system fans 201, it is unnecessary to impede air flow from the system fans 201 with the fan enclosure 100. The top cover makes forceful contact with the cam 102, thereby placing the fan enclosure 100 in the forced open position and allowing free air flow from the system fan 201 throughout the system enclosure.

Figure 3:
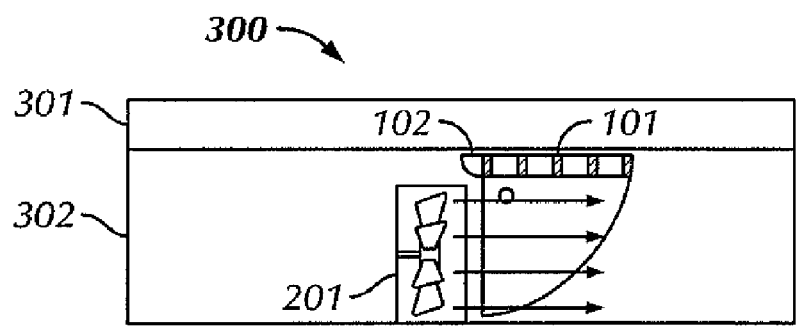
FIG. 3 shows a side view of a system enclosure in accordance with embodiments disclosed herein.

Referring now to FIG. 3, a side view of a system enclosure 300 including a top cover 301 and a case 302 is shown. A system fan 201 and a fan enclosure 100 are disposed within the system enclosure 300. FIG. 3 illustrates the forceful interaction between the top cover 301 in the closed position and the cam 102 that holds the fan enclosure 100 in the forced open position, thereby allowing free air flow throughout the system enclosure 300.

Embodiments of the fan enclosure disclosed herein may exhibit one or more of the following advantages. The fan enclosure may allow for maximized air flow within a system enclosure. Further, the fan enclosure may allow for maximized air flow while simultaneously maintaining safety compliance for users. The fan enclosure may comprise a low cost implementation due to its simple design. Finally, the fan enclosure may include automatic operation that is fool-proof from a user perspective.

While the invention has been described with respect to a limited number of embodiments, those skilled in the art, having benefit of this disclosure, will appreciate that other embodiments may be devised which do not depart from the scope of the invention as disclosed herein. Accordingly, the scope of the invention should be limited only by the attached claims.

What is claimed is:

1. A fan enclosure for a system comprising one more fans and a system enclosure, the fan enclosure comprising:
    a first pivot removably attached to the system enclosure;
    a safety compliant fan grill attached to the first pivot rotatably between a natural closed position and a forced open position, wherein the safety compliant fan grill covers the one or more fans in the natural closed position; and
    a cam disposed on the safety compliant fan grill, wherein the cam is configured to force the safety compliant fan grill into the forced open position as a top cover of the system enclosure is placed in a closed position.

2. The fan enclosure of claim 1, wherein the first pivot, safety compliant fan grill, and cam are integrally formed.

3. The fan enclosure of claim 1, wherein the first pivot, safety compliant fan grill, and cam are each formed from a plastic material.

4. The fan enclosure of claim 1, wherein the first pivot is a rod disposed through the safety compliant fan grill.

5. The fan enclosure of claim 4, wherein the rod is formed from a metal material.

6. The fan enclosure of claim 4, wherein the rod is formed from a plastic material.

7. The fan enclosure of claim 1, further comprising a plurality of cams disposed on the safety compliant fan grill.

8. The fan enclosure of claim 1, further comprising a second pivot removably attached to the system enclosure, wherein the safety compliant fan grill is disposed between the first and second pivots.

* * * * *